(12) United States Patent
Satoh et al.

(10) Patent No.: US 8,236,428 B2
(45) Date of Patent: Aug. 7, 2012

(54) HYBRID SILICON WAFER AND METHOD FOR MANUFACTURING SAME

(75) Inventors: Kazuyuki Satoh, Ibaraki (JP); Yoshimasa Koido, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 0 days.

(21) Appl. No.: 13/002,928

(22) PCT Filed: Jun. 23, 2009

(86) PCT No.: PCT/JP2009/061354
§ 371 (c)(1), (2), (4) Date: Feb. 4, 2011

(87) PCT Pub. No.: WO2010/004863
PCT Pub. Date: Jan. 14, 2010

(65) Prior Publication Data
US 2011/0123795 A1    May 26, 2011

(30) Foreign Application Priority Data
Jul. 10, 2008    (JP) .................................. 2008-179988

(51) Int. Cl.
*G11B 11/105* (2006.01)
*B32B 9/04* (2006.01)
*B32B 13/04* (2006.01)
*B32B 37/00* (2006.01)
*B32B 38/04* (2006.01)
*B29C 65/00* (2006.01)

(52) U.S. Cl. ..................... 428/446; 156/250; 156/272.2; 156/285; 428/332

(58) Field of Classification Search .................. 428/332, 428/446; 156/250, 272.2, 285
See application file for complete search history.

(56) References Cited

U.S. PATENT DOCUMENTS

| | | | |
|---|---|---|---|
| 4,921,026 A | 5/1990 | Flagella et al. | |
| 5,382,549 A | 1/1995 | Ohshima et al. | |
| 6,245,161 B1 | 6/2001 | Henley et al. | |
| 7,259,077 B2 | 8/2007 | Degani et al. | |
| 7,635,868 B2 | 12/2009 | Kojima et al. | |

(Continued)

FOREIGN PATENT DOCUMENTS

| | | | |
|---|---|---|---|
| JP | 01-153513 A | 6/1989 | |
| JP | 06-283469 A | 10/1994 | |
| JP | 05-229812 A | 9/1999 | |

(Continued)

OTHER PUBLICATIONS

Nicky Chau-Chun et al., "Modeling and Optimization of Monolithic Polycrystalline Silicon Resistors", IEEE Transactions on Electron Devices, vol. ED-28, No. 7, pp. 818-830, 1981 (month unknown).

*Primary Examiner* — Jonathan Langman
(74) *Attorney, Agent, or Firm* — Howson & Howson LLP

(57) ABSTRACT

Provided is a hybrid silicon wafer comprising a structure in which a single-crystal wafer is embedded in a sintered polysilicon wafer. Also provided is a method for manufacturing a hybrid silicon wafer having a structure in which a single-crystal wafer is embedded in a sintered polysilicon wafer, wherein a part of the sintered polysilicon is hollowed, a single crystal ingot is inserted into the hollowed portion, these are mutually bonded through thermal diffusion bonding based on HIP to prepare a complex of the sintered polysilicon and the single-crystal silicon ingot, and the complex is sliced. Thereby provided are a hybrid silicon wafer comprising functions of both the polysilicon wafer and the single-crystal wafer, and a method for manufacturing such a hybrid silicon wafer.

16 Claims, 2 Drawing Sheets

| U.S. PATENT DOCUMENTS | | | | FOREIGN PATENT DOCUMENTS | | |
|---|---|---|---|---|---|---|
| 2003/0153163 A1 | 8/2003 | Letertre et al. | JP | 11-340155 A | 12/1999 |
| 2004/0241959 A1 | 12/2004 | Letertre et al. | JP | 2000-286244 A | 10/2000 |
| 2008/0122042 A1 | 5/2008 | Goldstein et al. | JP | 2003-286023 A | 10/2003 |
| 2009/0263626 A1 | 10/2009 | Fujiwara | JP | 2004-284929 A | 10/2004 |
| 2010/0016144 A1 | 1/2010 | Suzuki et al. | JP | 2004-289065 A | 10/2004 |
| 2010/0187661 A1 | 7/2010 | Suzuki et al. | JP | 2005-132671 A | 5/2005 |
| 2010/0330325 A1 | 12/2010 | Suzuki et al. | WO | 2009/011233 A1 | 1/2009 |
| 2012/0009373 A1 | 1/2012 | Takamura et al. | WO | 2009/011234 A1 | 1/2009 |
| 2012/0009374 A1 | 1/2012 | Takamura et al. | WO | 2009/011235 A1 | 1/2009 |
| | | | WO | 2009/014961 A1 | 1/2009 |

[Figure 1]
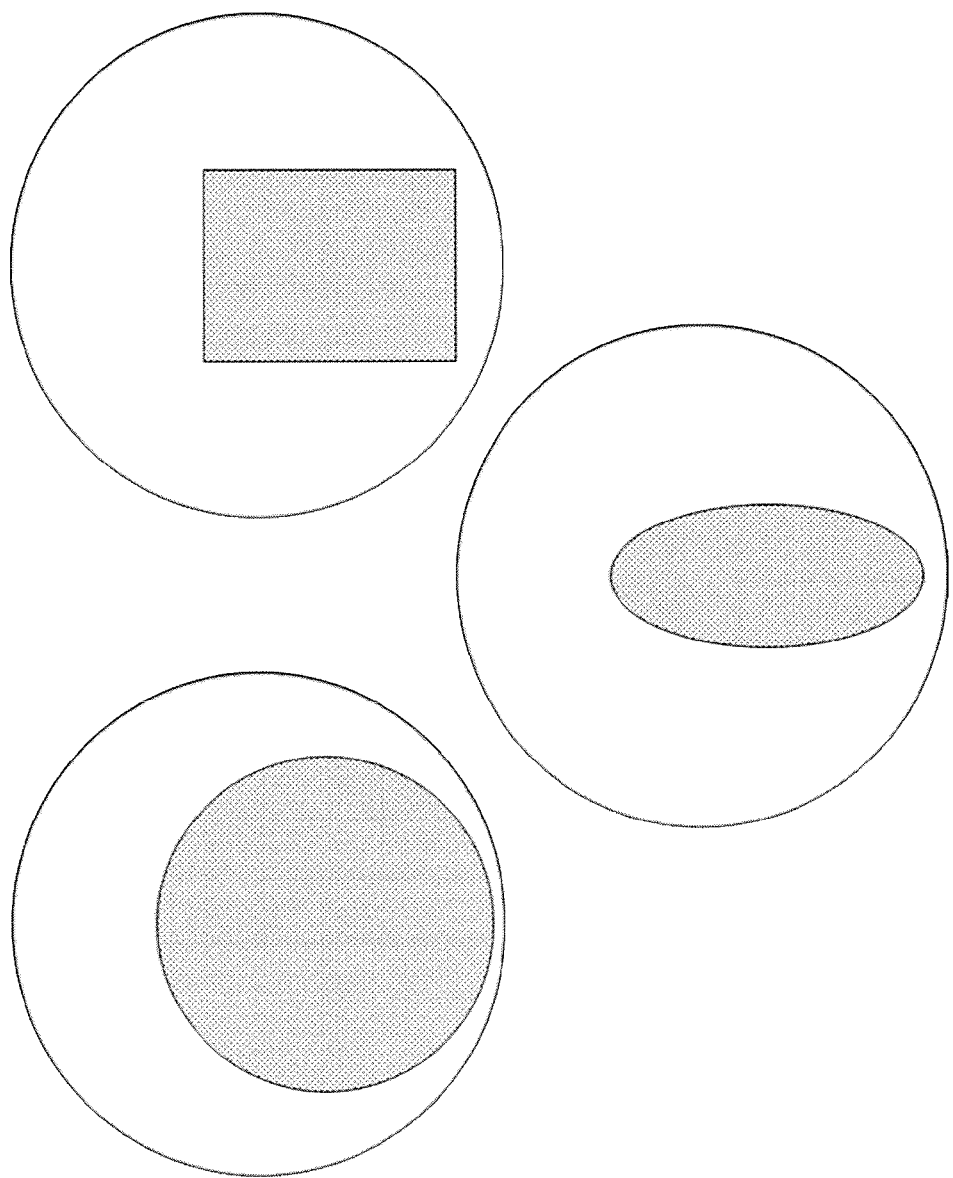

[Figure 2]
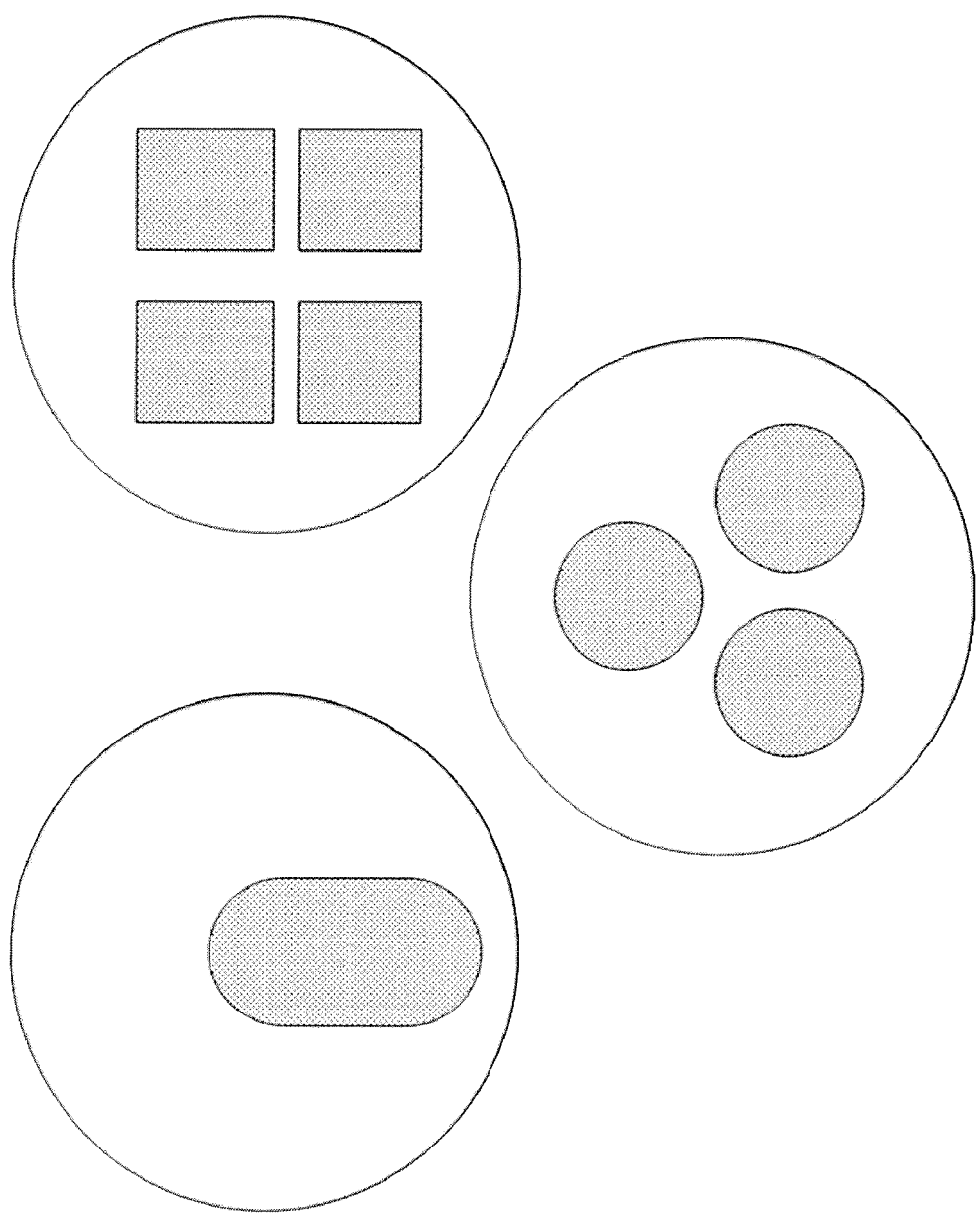

HYBRID SILICON WAFER AND METHOD FOR MANUFACTURING SAME

BACKGROUND OF THE INVENTION

The present invention relates to a hybrid silicon wafer comprising the functions of both a polysilicon wafer and a single-crystal wafer, and to the method for manufacturing such a hybrid silicon wafer.

In the silicon semiconductor manufacturing process, a wafer prepared based on single-crystal growth is primarily used. This single-crystal silicon wafer has increased in size with the times, and it is anticipated to be of φ 400 mm or larger in the near future. In addition, a so-called mechanical wafer for testing is now required in order to establish the apparatus and peripheral technology necessary for the semiconductor manufacturing process.

Generally speaking, since this kind of mechanical wafer is subject to fairly high precision testing, it needs to possess characteristics similar to the mechanical properties of a single-crystal silicon. Thus, if used for testing, the actual single-crystal silicon wafer was conventionally being used as is. However, since a single-crystal silicon wafer of φ 400 mm or larger is extremely expensive, an inexpensive wafer having similar characteristics to single-crystal silicon is in demand.

Meanwhile, as a component of such semiconductor manufacturing equipment, a proposal has also been made for using a sputtering target made out of a rectangular or disk-shaped silicon plate. While the sputtering method is being used as a means for forming thin films, there are several sputtering methods including the bipolar DC sputtering method, frequency sputtering method, magnetron sputtering method and the like, and thin films of various electronic parts are being formed using the sputtering characteristics unique to the respective methods.

This sputtering method is to place a substrate as the anode opposite to a target as the cathode, and generate an electrical field by applying a high voltage between the foregoing substrate and target under an inert gas atmosphere; and is based on the principle that ionized electrons and inert gas collide to form a plasma, the cations in the plasma collide with the target surface to knock out the target constituent atoms, and the discharged atoms adhere to the opposite substrate surface so as to form a film.

A sintered polysilicon is proposed for this kind of sputtering target, and this sintered compact target is required to be of considerable thickness and in a large rectangle or discoid shape in order to improve the deposition efficiency. Moreover, a proposal has also been made for using this sintered polysilicon as a board for retaining the single-crystal silicon wafer. Nevertheless, a polysilicon entails significant problems in that the sinterability is inferior, and the obtained products have low density and the low mechanical strength.

In light of the above, in order to improve the characteristics of the foregoing sintered silicon target, proposed is a sintered silicon formed by performing compression molding and sintering to the silicon powder obtained by being heated under reduced pressure and within a temperature range of 1200° C. or higher but less than the melting point of silicon to deoxidize, and setting the crystal grain size of the sintered compact to be 100 μm or less (for instance, refer to Patent Document 1).

However, if the thickness of the target manufactured as described above is thin; for instance, 5 mm or less, the density will relatively increase and the strength will also increase. But if the thickness becomes any thicker, the density will continue to be low (less than 99%), and the mechanical strength will also deteriorate. Thus, there is a problem in that it is not possible to manufacture a large-size rectangular or disk-shaped target.

In light of the foregoing circumstances, the present applicant previously proposed a sintered silicon in which the average crystal grain size is 50 μm or less and the relative density is 99% or more, and its production method (refer to Patent Document 2).

Although this sintered silicon possesses numerous advantages including high density and high mechanical strength, the further improvement of these characteristics is being demanded, and the applicant filed a patent application relating to technology that improved the foregoing points.

Since a wafer using the foregoing sintered silicon has similar mechanical properties as a single-crystal silicon, it can be used as a dummy wafer for the transport system of semiconductor manufacturing equipment or the development of robotics. In addition, the application as a base substrate of an SOI wafer is also being considered.

Nevertheless, these are all polysilicons made from a sintered silicon. Although there are numerous points that are similar to the physical properties of a single crystal, they do not possess the function as the single crystal itself, and there is a fundamental problem in that they cannot be used for process testing such as deposition experiments.

[Patent Document 1] Japanese Patent No. 3342898
[Patent Document 2] Japanese Patent No. 3819863

SUMMARY OF THE INVENTION

The present invention was devised in view of the foregoing points, and its object is to provide a hybrid silicon wafer comprising functions of both the polysilicon wafer and the single-crystal silicon wafer, and a method for manufacturing the such a hybrid silicon wafer.

In order to achieve the foregoing object, the present inventors discovered that it is possible to obtain a hybrid silicon wafer comprising functions of both the polysilicon wafer and the single-crystal silicon wafer can be obtained by foremost devising the sintering conditions to obtain sintered polysilicon with improved mechanical strength, and subsequently embedding single-crystal silicon into the foregoing sintered silicon.

Based on the foregoing discovery, the present invention provides:
1) A hybrid silicon wafer comprising a structure in which a single-crystal silicon is embedded in a sintered polysilicon;
2) The hybrid silicon wafer according to 1) above, wherein a bond part of the sintered polysilicon and the single-crystal silicon is diffusion-bonded;
3) The hybrid silicon wafer according to 1) or 2) above, wherein the peak strength of the modal crystal orientation at the sintered polysilicon portion is less than 50% of the overall peak strength in XRD measurement of the surface;
4) The hybrid silicon wafer according to any one of 1) to 3) above, wherein the longest diameter of the single-crystal silicon portion is more than 50% of the diameter of the overall wafer;
5) The hybrid silicon wafer according to any one of 1) to 4) above, wherein the maximum crystal grain size of the sintered polysilicon is 20 μm or less, and the average crystal grain size is 1 μm or more but 10 μm or less;
6) The hybrid silicon wafer according to any one of 1) to 5) above, wherein the sintered polysilicon portion has the following mechanical properties (1) to (3):
(1) the average deflecting strength based on a three-point bending test is 20 kgf/mm$^2$ or more but 50 kgf/mm$^2$ or less;

(2) the average tensile strength is 5 kgf/mm$^2$ or more but 20 kgf/mm$^2$ or less; and
(3) the average Vickers hardness is Hv 800 or more but Hv 1200 or less;
7) The hybrid silicon wafer according to any one of 1) to 6) above, further comprising a polished surface in which the difference in the surface roughness Ra between the single-crystal silicon and the sintered polysilicon is 0.02 µm or less;
8) A method for manufacturing a hybrid silicon wafer having a structure in which a single-crystal silicon is embedded in a sintered polysilicon, wherein a part of the sintered polysilicon is hollowed, a single crystal ingot is inserted into the hollowed portion, these are mutually bonded through thermal diffusion bonding based on HIP to prepare a complex of the sintered polysilicon and the single-crystal silicon ingot, and the complex is sliced;
9) The method for manufacturing a hybrid silicon wafer according to 8) above, wherein the single-crystal silicon ingot is pre-processed in accordance with the plane direction of the single-crystal silicon after being sliced, and subsequently embedded in the sintered polysilicon;
10) The method for manufacturing a hybrid silicon wafer according to 8) or 9) above, the single-crystal silicon and sintered polysilicon after being sliced are simultaneously processed and polished; and
11) The hybrid silicon wafer according to any one of 1) to 10) above, wherein the surface area of the single-crystal silicon portion is more than 50% of the surface area of the overall wafer.

According to the above, it is possible to provide a hybrid silicon wafer comprising functions of both the polysilicon wafer and the single-crystal wafer, and therefore a significant effect is yielded in that the characteristics and functions as a single-crystal wafer and the characteristics and functions as a polysilicon wafer can be simultaneously retained.

A sintered polysilicon wafer as the support base of the hybrid silicon wafer needs to be enlarged and strengthened. The sintered polysilicon wafer comprised in the hybrid silicon wafer of the present invention has characteristics similar to the mechanical properties of single-crystal silicon that is used as a mechanical wafer. Specifically, since the sintered polysilicon wafer has a high strength, and it is free from cracks and chipping and can be easily processed into complex shapes; it can be machined for embedding the single-crystal silicon. Based on these characteristics, a small diameter single-crystal silicon that is relatively inexpensive can be used, and single-crystal silicon of an appropriate size can be embedded in the required portion.

Moreover, since the sintered silicon can also be manufactured as a large ingot, a hybrid silicon wafer can be manufactured by embedding a single crystal ingot in the large ingot, bonding the interface thereof, and slicing the jointing material.

Accordingly, a hybrid silicon wafer comprising functions of both the polysilicon wafer and the single-crystal wafer has a significant feature of being able to considerably improve the production yield and reduce manufacturing costs in comparison to an independent single-crystal wafer of the same size.

BRIEF DESCRIPTION OF THE DRAWINGS

FIG. 1 is a conceptual diagram of the hybrid silicon wafer embedded with a disk-shaped, rectangular (oblong), and oval single-crystal silicon.

FIG. 2 is a conceptual diagram of the hybrid silicon wafer embedded with a racetrack-shaped, four square-shaped, and three disk-shaped single-crystal silicon.

DETAILED DESCRIPTION OF THE INVENTION

The hybrid silicon wafer of the present invention comprises a structure in which a single-crystal wafer is embedded in the sintered polysilicon wafer. Specifically, a single hybrid silicon wafer has a structure in which a sintered polysilicon wafer and a single-crystal wafer coexist. To put it differently, such structure is that a single-crystal wafer is retained in the sintered polysilicon wafer. The respective faces of the sintered polysilicon wafer and the single-crystal wafer are exposed on the surface, and comprise an equal polished surface since they are simultaneously subject to machining and polishing during the manufacturing stage. Under normal circumstances, the difference in surface roughness Ra of the respective surfaces of the sintered polysilicon wafer and the single-crystal wafer is desirably 0.02 µm or less.

it is effective that the sintered polysilicon wafer portion has a structure in which the maximum crystal grain size is 20 µm or less, and the average crystal grain size is 1 µm or more but 10 µm or less.

Based on the foregoing structure, it becomes possible to achieve a mechanical strength that is roughly equal to a single-crystal wafer; specifically, the average deflecting strength based on a three-point bending test is 20 kg f/mm$^2$ or more but 50 kgf/mm$^2$ or less, the average tensile strength is 5 kgf/mm$^2$ or more but 20 kgf/mm$^2$ or less, and the average Vickers hardness is Hv 800 or more but Hv 1200 or less.

The biggest weakness with a sintered silicon wafer is deterioration in the deflecting strength (bending strength), but the present invention is able to overcome the foregoing weakness.

Moreover, with the sintered polysilicon wafer, it is desirable that the peak strength of the modal crystal orientation is less than 50% of the overall peak strength in XRD measurement of the surface. It is thereby possible to provide a sintered silicon wafer having the surface roughness equivalent to a single-crystal silicon. This is a result of adjusting the crystal orientation of the sintered silicon wafer.

The sintered polysilicon wafer to become the support base of the single-crystal silicon wafer can be manufactured in a large size. For example, it is difficult to prepare a single-crystal silicon in a large size exceeding φ 400 mm. Even if it is possible to prepare such as large single-crystal silicon, it will be extremely expensive. But with a sintered polysilicon wafer, it is easy to prepare a sintered silicon wafer of φ 400 mm or more. Accordingly, for instance, a hybrid wafer in which a disk-shaped single-crystal silicon wafer is embedded in a part of a disk-shaped sintered polysilicon wafer of φ 400 mm or more can be manufactured easily and inexpensively.

The shape of these wafers is not limited to a discoid shape, and it should be easy to understand that they may also be manufactured in a rectangle shape or the like. Moreover, the shape of the single-crystal silicon to be embedded is not limited to a discoid shape, and it can also be prepared in a rectangle, ellipse/oval, racetrack shape or the like. FIG. 1 is a conceptual diagram of the hybrid silicon wafer embedded with a disk-shaped, rectangular (oblong), and oval single-crystal silicon. FIG. 2 is a conceptual diagram of the hybrid silicon wafer embedded with a racetrack-shaped, four square-shaped, and three disk-shaped single-crystal silicon.

Although there is no particular limitation regarding the size of the single-crystal silicon, it is desirable that the longest diameter of the single-crystal wafer is more than 50% of the diameter of the overall wafer. Consequently, the hybrid silicon wafer can be effectively utilized in tests that use the characteristics of a single-crystal wafer. This is particularly effective when testing the distribution in the radial direction.

Moreover, since the single-crystal silicon portion can be embedded in various shapes simultaneously such as a rectangle, ellipse/oval, racetrack shape or the like in addition to a discoid shape, in the foregoing case, the surface area of the single-crystal silicon portion can be made to be more than 50% of the surface area of the overall wafer.

Nevertheless, the present invention is not limited to the foregoing shapes. Limit of size is within a range that the single-crystal wafer can be retained in the sintered polysilicon wafer, and there is no particular limitation. Moreover, it is also possible to embed a single-crystal wafer that is smaller than the foregoing examples. Furthermore, in order to increase the bonding strength between the sintered polysilicon wafer and the single-crystal wafer, it is desirable that the bond parts are mutually diffusion-bonded, but an adhesive layer may also be inserted therebetween depending on the usage.

As a method for producing a sintered silicon, for instance, silicon powder prepared by pulverizing high-purity coarse silicon of 5N or higher in a jet mill is baked under reduced pressure within a temperature range of 1100 to 1300° C., preferably less than 1200° C. to deoxidize, subject to primary sintering based on hot press, and then subject to HIP treatment within a temperature range of 1200 to 1420° C. and at a pressure of 1000 atmospheres or greater.

Here, by using high-purity silicon powder and adopting the foregoing deoxidation conditions based on the pulverization and baking of the powder, and the conditions of temperature and pressure in the HIP treatment; the crystal grain size can be adjusted, and the sintering conditions are adjusted so that the maximum crystal grain size becomes 20 µm or less and the average crystal grain size becomes 1 µm or more but 10 µm or less. Upon sintering, it is particularly effective to use silicon powder having an average grain size of 10 µm or less.

In addition, deoxidation is important, and sufficient deoxidation is required for obtaining a sintered silicon of fine crystals. The reason the baking temperature was set to be within a range of 1000 to 1300° C., preferably less than 1200° C., is because the elimination of oxygen will be insufficient if the temperature is less than 1000° C.

Deoxidation will proceed at 1200° C. or higher, but necking (phenomenon where powders adhere to each other) will increase, and, even if the necking is undone during the hot press, there are drawbacks in that there will be variations in the grain size distribution and the working hours will become long. Thus, it is required that the upper temperature limit is set to 1300° C.

In the HIP conditions, if the temperature is less than 1100° C. and the pressure is less than 1000 atmospheres, a high-density sintered silicon cannot also be obtained, and it will exceed the melting point of Si at a temperature of 1420° C. With respect to the retention time in the respective processes, it is desirable that the baking time is roughly 5 hours, hot pressing is performed for roughly 10 hours, and the HIP treatment is performed for roughly 3 hours. Prolonged HIP treatment is undesirable since the crystal grains will become coarse. However, these times may be changed as needed according to the processing conditions, and the present invention is not limited to the foregoing length of time.

Upon manufacturing the hybrid silicon wafer of the present invention, as described above, a part of the sintered polysilicon that is prepared in advance is hollowed, a single crystal ingot is inserted into the hollowed portion, and a complex of the sintered polysilicon and the single-crystal silicon ingot is prepared by bonding to each other through thermal diffusion bonding based on HIP.

Subsequently, the complex is sliced to prepare a hybrid silicon wafer having a structure in which a single-crystal silicon wafer is embedded in a sintered polysilicon.

This manufacturing method aims to manufacture numerous hybrid silicon wafers at once, but a hybrid silicon wafer can also be manufactured one by one as a matter of course.

Upon slicing the complex to prepare the hybrid silicon wafer, preferably, the single-crystal silicon ingot is pre-processed in accordance with the plane direction of the single-crystal wafer after being sliced, and subsequently embedded in the sintered polysilicon. It is thereby possible to form a single-crystal silicon wafer with an adjusted plane direction simply by carving out the single-crystal wafer portion of the hybrid silicon wafer. The single-crystal wafer and the sintered polysilicon wafer after being sliced, which are obtained as described above, are simultaneously processed and polished to manufacture a hybrid silicon wafer.

The foregoing hybrid silicon wafer is able to effectively utilize the function as a single-crystal wafer. Not only can it be used as a mechanical wafer (or a dummy wafer), it can also be used as a test wafer for equipment testing such as deposition experiments on a single crystal. Moreover, since it has a function as the sintered polysilicon wafer; that is, the mechanical strength is high and the workability is superior, the present invention can also be used as a sputtering target or various parts of semiconductor manufacturing equipment such as a holder. Upon manufacturing parts, the sintered silicon wafer is free from the generation of cracks and chipping and can also be easily processed into complex shapes, and therefore it yields a superior effect of being able to considerably improve the production yield and reduce the manufacturing costs.

Accordingly, the "hybrid silicon wafer" of the present invention is available for multipurpose utilization, and a silicon wafer comprising the foregoing characteristics did not conventionally exist.

EXAMPLES

The present invention is now explained in detail with reference to the Examples. These Examples are merely for facilitating the understanding of this invention, and the present invention shall in no way be limited thereby. In other words, various modifications and other embodiments based on the technical spirit claimed in the claims shall be covered by the present invention as a matter of course.

Example 1

Silicon powder having an average grain size of 7 µm that was prepared by pulverizing silicon coarse grains having a purity of 6N with a jet mill was subject to baking treatment under reduced pressure at a temperature of 1000° C. for 5 hours to deoxidize.

Subsequently, hot press was performed by simultaneously setting the temperature at 1200° C. and the bearing at 200 kgf/cm$^2$, and this was thereafter subject to HIP at a temperature of 1200° C. and a welding pressure of 1400 atmospheres to obtain a sintered silicon of φ 410 mm.

The crystal grain size can be arbitrarily adjusted by using fine high-purity silicon, selecting the baking (deoxidation) conditions, and selecting the temperature and welding pressure of HIP, respectively.

This sintered polysilicon had an average crystal grain size of 7 μm and a maximum crystal grain size of 16 μm. The mechanical strength of the sintered silicon was measured. Upon measuring the mechanical strength, it was once processed to a wafer, and thereafter five points of the wafer were arbitrarily sampled to obtain an average value.

Consequently, the average bending strength of the five sampled points was 26 kgf/mm$^2$, the average tensile strength was 14 kgf/mm$^2$, and the average Vickers hardness was Hv 1000. This sintered polysilicon satisfied the characteristics required as a mechanical wafer.

As described above, since the sintered polysilicon wafer possesses sufficient strength, even when processing this into a hybrid silicon wafer and increasing the diameter of the wafer to 420 mm, 440 mm, 460 mm and so on, cracks or chipping did not occur. Since it is undesirable for impurities to get mixed into the sintered silicon, silicon having a purity of 6N was used. However, so as long as the purity is 5N or higher, the silicon can be used without any particular problem. Moreover, so as long as the purity is 5N or higher, the mechanical properties were not affected.

Subsequently, the sintered polysilicon (φ 410 mm) was used and a part of the sintered polysilicon was hollowed out. And a single crystal ingot (φ 190 mm) that was prepared in advance was inserted into such hollowed portion. The clearance of the sintered polysilicon and the single crystal ingot was 0.1 mm or less.

The sintered polysilicon and the single-crystal silicon ingot were mutually bonded by thermal diffusion bonding based on HIP at a temperature of 1200° C. for 2 hours to prepare a complex of the sintered polysilicon and the single-crystal silicon ingot.

Subsequently, the complex was sliced into a thickness of 1.01 mm, and twelve hybrid silicon wafers having a structure in which a single-crystal wafer of φ 190 mm is embedded in a sintered polysilicon wafer of φ 410 mm were prepared. Polishing was thereafter performed to obtain a mirror hybrid silicon wafer having an average surface roughness Ra of 0.02 μm.

Consequently, it was possible to obtain a hybrid silicon wafer having a structure in which a single-crystal wafer is embedded in a sintered polysilicon wafer, wherein pores are not generated at the bonding interface and peeling and cracks do not occur.

Example 2

Upon preparing a complex under the same conditions as Example 1, the single-crystal silicon ingot was pre-processed in accordance with the plane direction of the single-crystal wafer to be sliced in order to achieve a surface with a (100) plane direction, and this was embedded in the sintered polysilicon. It was thereby possible to obtain a single-crystal silicon wafer in which the plane direction was adjusted to (100) merely by carving out the single-crystal wafer portion of the hybrid silicon wafer.

A hybrid silicon wafer was manufactured by simultaneously processing and polishing the single-crystal wafer and the sintered polysilicon wafer after being sliced, which were obtained as described above. Consequently, it was possible to obtain a hybrid silicon wafer with no generation of pores at the bonding interface and free from the generation of peeling and cracks.

Examples 3 to 7

Fine silicon powder having a purity of 5N and 6N and an average crystal grain size of 1 to 10 μm was, as with Example 1, baked under reduced pressure and within a temperature range of 1100 to 1300° C. to deoxidize, this was subsequently hot pressed within a temperature range of 1200 to 1420° C. and a bearing of 200 kgf/cm$^2$ or greater, and the silicon obtained thereby was further subject to HIP treatment within a temperature range of 1200 to 1420° C. and a pressure of 1000 atmospheres or higher so as to produce a sintered silicon with a size of φ 460 mm, the maximum crystal grain size of 20 μm or less, and the average crystal grain size in a range of 1 μm to 10 μm or less.

As a result of preparing a wafer from the sintered silicon obtained as described above, the average deflecting strength was 21 to 33 kgf/mm$^2$, the average tensile strength was 12 to 17 kgf/mm$^2$, and the average Vickers hardness was Hv 830 to Hv 1120. In all Examples, the average deflecting strength based on the three-point bending test was 20 kgf/mm$^2$ or more but 50 kgf/mm$^2$ or less, the average tensile strength was 5 kgf/mm$^2$ or more but 20 kgf/mm$^2$ or less, and the average Vickers hardness was in the range of Hv 800 or more but Hv 1200 or less. All these Examples possessed the mechanical properties of the present invention and could be used as a mechanical wafer.

Subsequently, the sintered polysilicon (φ 460 mm) was used and a part of the sintered polysilicon was hollowed out. And, a single crystal ingot (φ 300 mm) that was prepared in advance was inserted into such hollowed portion. The clearance of the sintered polysilicon and the single crystal ingot was 0.1 mm or less.

The sintered polysilicon and the single-crystal silicon ingot were mutually bonded by thermal diffusion bonding based on HIP at a temperature of 1200° C. for 2 hours to prepare a complex of the sintered polysilicon and the single-crystal silicon ingot.

Subsequently, the complex was sliced into a thickness of 1.01 mm, and twenty hybrid silicon wafers having a structure in which a single-crystal wafer of φ 300 mm is embedded in a sintered polysilicon wafer of φ 460 mm were prepared. Polishing was thereafter performed to obtain a mirror hybrid silicon wafer having an average surface roughness Ra of 0.02 μm.

Consequently, it was possible to obtain a hybrid silicon wafer having a structure in which a single-crystal wafer is embedded in a sintered polysilicon wafer, wherein pores are not generated at the bonding interface and peeling and cracks do not occur.

Comparative Example 1

Silicon powder having a purity of 5N and an average grain size of 10 μm was used, and a sintered silicon wafer having an average crystal grain size of 12 μm and a maximum crystal grain size of 25 μm was prepared by respectively selecting the baking (deoxidation) conditions, and the temperature and welding pressure of HIP. As with Example 1, the mechanical strength of the sintered silicon wafer was measured. The measured value of the mechanical strength was the average of five sampled points.

Consequently, the deflecting strength (bending strength) was 16 kgf/mm$^2$, the tensile strength was 10 kgf/mm$^2$, and the Vickers hardness was Hv 790. This Comparative Example failed to satisfy the bending strength and Vickers hardness required as a mechanical wafer. This is considered to be because it did not satisfy the conditions of the present invention; namely, a maximum crystal grain size of 20 μm or less and an average grain size of 1 μm to 10 μm.

A hybrid silicon wafer was not prepared since the sintered silicon wafer was of insufficient strength.

Comparative Example 2

A silicon ingot having a maximum crystal grain size of 8 mm and an average crystal grain size of 2 mm was prepared with the melting method, and this was cut out into a silicon wafer. The mechanical strength of the cast silicon wafer was measured as with Example 1. The measured value of the mechanical strength was the average of five sampled points.

Consequently, the average deflecting strength was 8 kgf/mm$^2$, the average tensile strength was 5 kgf/mm$^2$, and the average Vickers hardness was Hv 780. In particular, the average deflecting strength and the average tensile strength deteriorated considerably, and this Comparative Example failed to satisfy the mechanical properties as a mechanical wafer. The deterioration of these characteristics is considered to be due to the coarsening of the crystal grain size.

A hybrid silicon wafer was not prepared since the sintered silicon wafer was of insufficient strength.

Comparative Examples 3 to 7

Silicon powder having a purity of 5N was used, and a sintered silicon wafer having the average crystal grain size and the maximum crystal grain size of which at least one is greater than the present invention was prepared by respectively selecting the baking (deoxidation) conditions, and the temperature and welding pressure of HIP. As with Example 1, the mechanical strength of the sintered silicon wafer was measured. The measured value of the mechanical strength was the average of five sampled points. Consequently, with Comparative Examples 3 to 6, the average deflecting strength was 12 to 19 kgf/mm$^2$, the average tensile strength was 7 to 11 kgf/mm$^2$, and the average Vickers hardness was Hv 720 to Hv 820. All these Comparative Examples failed to satisfy the bending strength and the Vickers hardness required as a mechanical wafer.

Consequently, with Comparative Examples 3 to 6, the average deflecting strength was 12 to 19 kgf/mm$^2$, the average tensile strength was 7 to 11 kgf/mm$^2$, and the average Vickers hardness was Hv 720 to Hv 820. All these Comparative Examples failed to satisfy the bending strength and the Vickers hardness required as a mechanical wafer.

Meanwhile, with Comparative Example 7, the tensile strength and the Vickers hardness became greater than those of the single-crystal silicon wafer, and there was a problem in that the mechanical properties are not similar. Thus, the sintered silicon wafer of Comparative Example 7 was also not suitable. This is considered to be because it did not satisfy the conditions of the present invention; namely, a maximum crystal grain size of 20 μm or less and an average grain size of 1 μm to 10 μm.

A hybrid silicon wafer was not prepared with the foregoing sintered silicon wafers since these did not comprise the functions as a sintered silicon wafer.

Since it is possible to provide a hybrid silicon wafer comprising functions of both the polysilicon wafer and the single-crystal wafer as described above, a significant effect is yielded in that the characteristics and functions as a single-crystal wafer and the characteristics and functions as a polysilicon wafer can be simultaneously retained.

A sintered polysilicon wafer as the support base of the hybrid silicon wafer needs to be enlarged and strengthened. The sintered polysilicon wafer comprised in the hybrid silicon wafer of the present invention has characteristics similar to the mechanical properties of single-crystal silicon that is used as a mechanical wafer. Specifically, the sintered polysilicon wafer has a high strength, and it is free from cracks and chipping and can be easily processed into complex shapes. Thus, since a hybrid silicon wafer comprising functions of both the polysilicon wafer and the single-crystal wafer has a significant feature of being able to considerably improve the production yield and reduce manufacturing costs in comparison to an independent single-crystal wafer, it is effective as a test wafer of a deposition system and the like, as a sputtering target, and as various parts of semiconductor manufacturing equipment.

The invention claimed is:

1. A hybrid silicon wafer comprising a structure in which a single-crystal silicon is embedded in a sintered polysilicon, wherein a maximum crystal grain size of the sintered polysilicon is 20 μm or less and an average grain size is 1 μm or more but 10 μm or less, and wherein said wafer being obtained by slicing an ingot complex in which a single crystal silicon ingot is embedded in a sintered polysilion ingot and these are bonded together through thermal diffusion bonding.

2. The hybrid silicon wafer according to claim 1, wherein a bond part of the sintered polysilicon and the single-crystal silicon is diffusion bonded.

3. The hybrid silicon wafer according to claim 2, wherein a peak strength of a modal crystal orientation at a sintered polysilicon portion of the hybrid silicon wafer is less than 50% of an overall peak strength in XRD measurement of a surface of the structure.

4. The hybrid silicon wafer according to claim 3, wherein a longest diameter of a single-crystal silicon portion of the hybrid silicon wafer is more than 50% of a diameter of the overall hybrid silicon wafer.

5. The hybrid silicon wafer according to claim 4, wherein the sintered polysilicon has the following mechanical properties (1) to (3):
   (1) an average deflecting strength based on a three-point bending test is 20 kgf/mm$^2$ or more but 50 kgf/mm$^2$ or less;
   (2) an average tensile strength is 5 kgf/mm$^2$ or more but 20 kgf/mm$^2$ or less; and
   (3) an average Vickers hardness is Hv 800 or more but Hv 1200 or less.

6. The hybrid silicon wafer according to claim 5, further comprising a polished surface in which a difference in the surface roughness Ra between the single-crystal and the sintered polysilicon is 0.02 μm or less.

7. A hybrid silicon wafer according to claim 6, wherein the surface area of the single-crystal silicon is more than 50% of the surface area of the overall hybrid silicon wafer.

8. A hybrid silicon wafer according to claim 1, wherein a peak strength of a modal crystal orientation at a sintered polysilicon portion of the hybrid silicon wafer is less than 50% of an overall peak strength in XRD measurement of a surface of the structure.

9. A hybrid silicon wafer according to claim 1, wherein a longest diameter of a single-crystal silicon portion of the hybrid silicon wafer is more than 50% of a diameter of the overall hybrid silicon wafer.

10. A hybrid silicon wafer according to claim 1, wherein the sintered polysilicon has the following mechanical properties: an average deflecting strength based on a three-point bending test of 20 kgf/mm$^2$ to 50 kgf/mm$^2$; an average tensile strength of 5 kgf/mm$^2$ to 20 kgf/mm$^2$; and an average Vickers hardness of Hv 800 to Hv 1200.

11. A hybrid silicon wafer according to claim 1, further comprising a polished surface in which a difference in the surface roughness Ra between the single-crystal and the sintered polysilicon is 0.02 μm or less.

12. A hybrid silicon wafer according to claim 1, wherein the surface area of the single-crystal silicon is more than 50% of the surface area of the overall hybrid silicon wafer.

13. A hybrid silicon wafer comprising a structure in which single-crystal silicon is embedded in sintered polysilicon, the sintered polysilicon having an average deflecting strength based on a three-point bending test of 20 kgf/mm$^2$ to 50 kgf/mm$^2$, an average tensile strength of 5 kgf/mm$^2$ to 20 kgf/mm$^2$, and an average Vickers hardness of Hv 800 to Hv 1200, and the structure being obtained by slicing an ingot complex in which a single crystal silicon ingot is embedded in a sintered polysilion ingot in which the single crystal silicon ingot and sintered polysilicon ingot are bonded together via thermal diffusion bonding.

14. A method for manufacturing a hybrid silicon wafer of claim 1, comprising a structure in which a single-crystal silicon wafer is embedded in a sintered polysilicon, wherein a maximum crystal grain size of the sintered polysilicon is 20 μm or less and an average grain size is 1 μm or more but 10 μm or less, and wherein a part of a sintered polysilicon ingot is hollowed, a single crystal silicon ingot is inserted into the hollowed part of the sintered polysilicon ingot, these are mutually bonded through thermal diffusion bonding based on HIP to prepare a complex of the sintered polysilicon ingot and the single-crystal silicon ingot, and the complex is sliced.

15. A method according to claim 14, wherein the single-crystal silicon wafer and the sintered polysilicon wafer after being sliced are simultaneously processed and polished.

16. A method according to claim 14, wherein the surface area of the single-crystal silicon wafer is more than 50% of the surface area of the overall hybrid silicon wafer.

* * * * *